United States Patent
Lee et al.

(10) Patent No.: US 8,445,790 B2
(45) Date of Patent: May 21, 2013

(54) CORELESS SUBSTRATE HAVING FILLED VIA PAD AND METHOD OF MANUFACTURING THE SAME

(75) Inventors: Seok Kyu Lee, Gyunggi-do (KR); Soon Oh Jung, Gyunggi-do (KR); Jong Kuk Hong, Gyunggi-do (KR); Soon Jin Cho, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 443 days.

(21) Appl. No.: 12/320,284

(22) Filed: Jan. 22, 2009

(65) Prior Publication Data
US 2010/0096177 A1    Apr. 22, 2010

(30) Foreign Application Priority Data
Oct. 20, 2008 (KR) .......................... 10-2008-0102626

(51) Int. Cl.
*H05K 1/11*    (2006.01)
(52) U.S. Cl.
USPC ............ 174/264; 174/261; 174/262; 174/265
(58) Field of Classification Search
USPC ............................ 174/264, 262, 256, 265, 261
See application file for complete search history.

(56) References Cited

U.S. PATENT DOCUMENTS

| | | | | |
|---|---|---|---|---|
| 6,998,308 B2 * | 2/2006 | Ooi et al. | ....................... | 438/253 |
| 2006/0286714 A1 * | 12/2006 | Shibata | ........................ | 438/106 |
| 2007/0263370 A1 * | 11/2007 | Niki | .............................. | 361/783 |
| 2008/0179744 A1 * | 7/2008 | Yu | ................................. | 257/750 |

FOREIGN PATENT DOCUMENTS

| KR | 10-2007-0065789 | 6/2007 |
|---|---|---|
| KR | 10-2007-0103062 A | 10/2007 |

OTHER PUBLICATIONS

Korean Office Action issued Dec. 6, 2010 in corresponding Korean Patent Application 10-2008-0102626.
Korean Patent Office Action, dated Jul. 1, 2010.

* cited by examiner

*Primary Examiner* — Yuriy Semenenko
*Assistant Examiner* — Andargie M Aychillhum (57) ABSTRACT

Disclosed herein is a coreless substrate having filled via pads and a method of manufacturing the same. Insulating layers are formed on both sides of a build-up layer, and via-pads are embedded in the insulating layers such that the via-pads are flush with the insulating layers. The via pads are not separated from a substrate, and thus reliability of the pads is increased. Flatness of bumps is increased, and thus bonding of flip chips becomes easy.

4 Claims, 11 Drawing Sheets

FIG.1

Prior Art

FIG.2

Prior Art

FIG.3

Prior Art

FIG. 4

Prior Art

FIG. 5

Prior Art

CORELESS SUBSTRATE HAVING FILLED VIA PAD AND METHOD OF MANUFACTURING THE SAME

CROSS REFERENCE TO RELATED APPLICATION

This application claims the benefit of Korean Patent Application No. 10-2008-0102626, filed Oct. 20, 2008, entitled "CORELESS SUBSTRATE HAVING FILLED VIA PAD AND A MANUFACTURING METHOD THE SAME", which is hereby incorporated by reference in its entirety into this application.

BACKGROUND OF THE INVENTION

1. Field of the Invention

The present invention relates to a coreless substrate having filled via pads and a method of manufacturing the same, and more particularly to a coreless substrate having filled via pads in which a filled via having the same height as that of an insulating layer is used as a pad and a method of manufacturing the same.

2. Description of the Related Art

These days, with developments in the electronics industry, demands for the miniaturization and increased functionality of electronic components have rapidly increased, and printed circuit boards incorporating such electronic components therein also are requiring high density circuit and thin substrates.

In particular, a typical build-up printed circuit board is manufactured in a manner such that a build-up layer is formed on a core substrate, and thus the resulting build-up printed circuit board product still containing the core substrate therein is used. Unfortunately, this causes an increase in the total thickness of the printed circuit board. If a thickness of the printed circuit board increases, the length of the circuit is elongated, and thus an increased amount of time is required for signal processing.

To solve the above problems, a coreless substrate rather than a core substrate having a thick thickness has been proposed. FIGS. 1 to 5 show a process of manufacturing the conventional coreless substrate.

Hereinafter, a process of manufacturing the conventional coreless substrate is described with reference to FIGS. 1 to 5.

Figure 1:
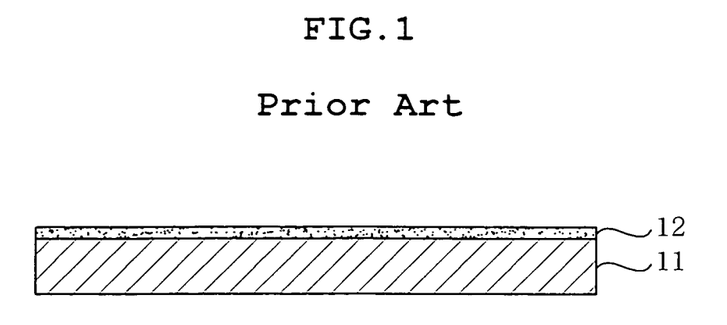
FIGS. 1 to 5 are cross-sectional views showing a conventional process of manufacturing a coreless substrate.

As shown in FIG. 1, a lower insulating layer 12 is first formed on a metal carrier 11 for supporting a coreless substrate.

Figure 2:
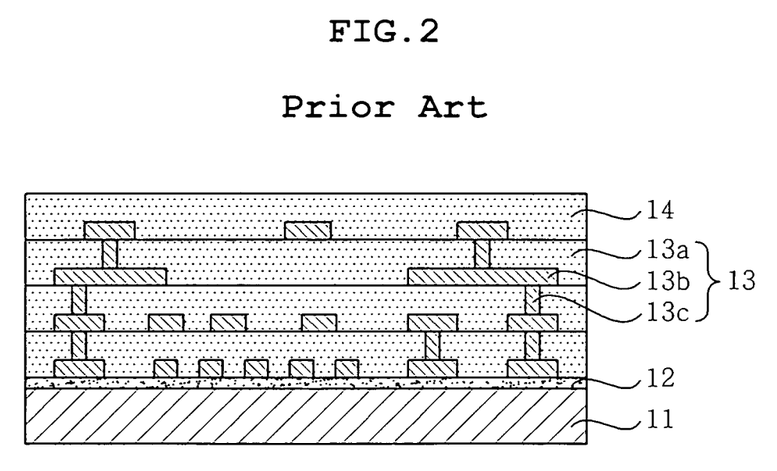

As shown in FIG. 2, a build-up layer 13, which includes a circuit layer 13b composed of a plurality of build-up insulating layers 13a and a plurality of circuit layers 13b having vias 13c, is formed on the lower insulating layer 12, and an upper insulating layer 14 is formed on the build-up layer 13.

Figure 3:
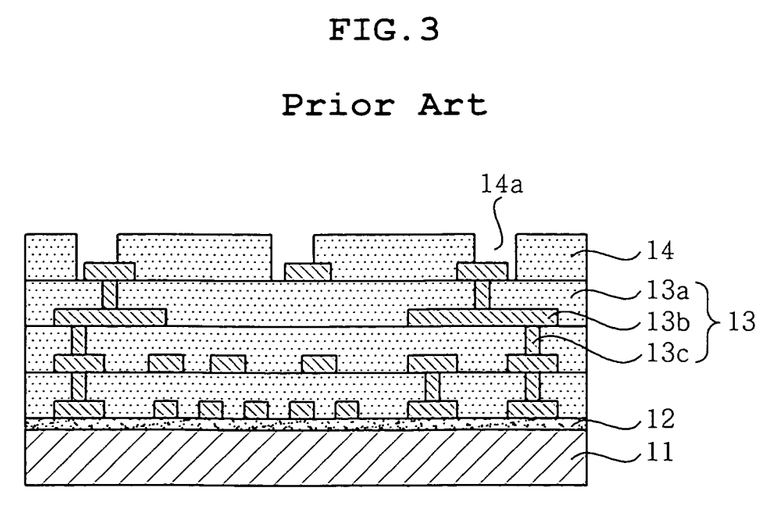

Subsequently, as shown in FIG. 3, upper openings 14a are formed in the upper insulating layer 14 such that upper pads of the uppermost circuit layer 13b contained in the build-up layer 13 are exposed through the upper openings 14a. In this process, the openings 14a may be formed using a drilling machining or a laser radiation.

Figure 4:
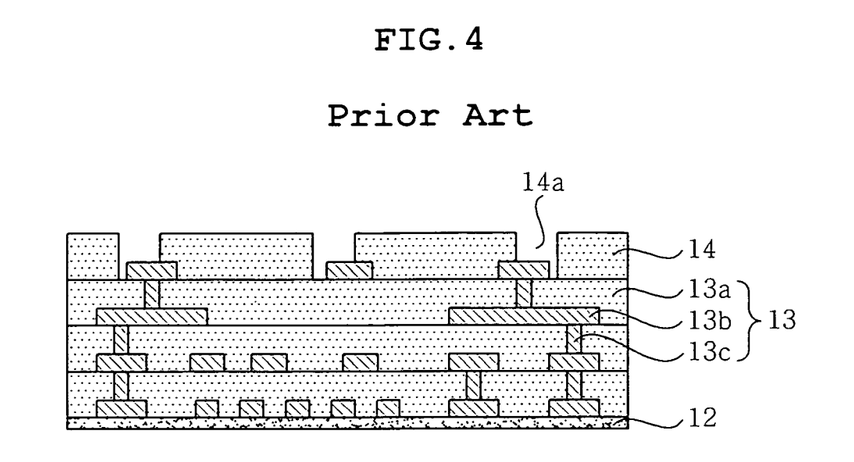

As shown in FIG. 4, the metal carrier 11 is eliminated using etching.

Figure 5:
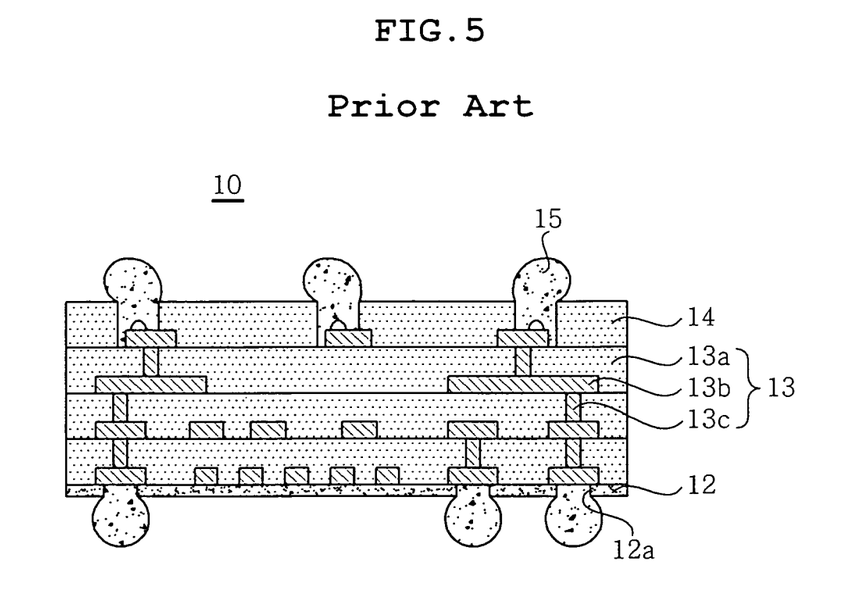

Finally, as shown in FIG. 5, lower openings 12a are formed in the lower insulating layer 12 such that lower pads of the lowermost circuit layer 13b contained in the build-up layer 13 are exposed through the lower openings 12a, and then solder balls 15 are formed on the upper and lower pads for the connection with exterior connecting terminals.

Through the above-described process, the conventional coreless substrate 10 is manufactured.

However, the conventional coreless substrate 10 and the method of manufacturing the coreless substrate have the following disadvantages.

First, since the conventional coreless substrate 10 is configured such that the upper and lower pads are exposed through the upper openings 14a and the lower openings 12a, respectively, as shown in FIG. 5, the coreless substrate may have stepped portions which deteriorate matching accuracy between the solder balls 15 and the upper/lower pads and also deteriorate the reliability of bonding.

Furthermore, since the conventional method of manufacturing a coreless substrate 10 involves the use of a metal carrier 11 to support the coreless substrate 10 during the manufacturing process, manufacturing costs are increased. In addition to this, since the method involves an etching process of eliminating the metal carrier 11, manufacturing time is increased.

Also, since the build-up layer 13 is provided only at one side with respect to the metal carrier 11, productivity thereof is decreased. In addition, when the process of forming the build-up layer is conducted only at one side, products become seriously warped during the manufacturing process.

In addition, during drilling or laser machining when forming the upper openings 14a and the lower openings 12a in the upper insulating layer 14 and the lower insulating layer 12 so as to expose the upper and lower pads through the upper and lower openings, the coreless substrate 10 become warped, and stepped portions are inevitably generated between the pads and the openings 12a and 14a due to the thicknesses of the upper insulating layer 14 and the lower insulating layer 12.

Furthermore, when the metal mask and the thin coreless substrate 10 are bonded to each other in the screen printing process of forming solder balls or bumps for connecting the coreless substrate 10 with an electronic component, a clearance occurs therebetween, thus hindering an even application of solder onto the coreless substrate 10. Because of the above problems, uniformities of heights and diameters of solder balls or bumps are decreased in the reflow and coining processes, thus decreasing the production yield.

SUMMARY OF THE INVENTION

Accordingly, the present invention has been made keeping in mind the above problems occurring in the prior art, and the present invention provides a coreless substrate having filled via pads in which filled vias are used as pads without need of forming additional openings for exposing the pads therethrough.

The present invention also provides a method of manufacturing a coreless substrate having filled via pads, which does not use a metal carrier requiring high manufacturing costs and a longer time for elimination.

The present invention also provides a method of manufacturing a coreless substrate having filled via pads, which increases the production yield and reduces the warp of products by conducting a build-up process on both sides of the a carrier.

The present invention also provides a method of manufacturing a coreless substrate having filled via pads, which obviates the need for a drilling or laser machining process to be conducted to expose the pads, by adopting filled vias as pads, thus preventing generation of warp and stepped portions.

The present invention also provides a coreless substrate having filled via pads and a method of manufacturing the same, which facilitates formation of solder balls or bumps and improves uniformity of heights and diameters of the solder balls or bumps.

In an aspect, the present invention provides a coreless substrate having filled via pads, including: a build-up layer including a build-up layer and a build-up circuit layer having a build-up via; first and second insulating layers disposed on both sides of the build-up layer; and first and second filled via pads formed in the first and second insulating layers, respectively.

The first and second filled via pads may be embedded in the first and second insulating layers such that a surface of each of the filled via pads is flush with a surface of a corresponding insulating layer.

The first and second filled via pads may have shapes facing each other.

The second filled via pads and the build-up via have shapes corresponding to each other.

The coreless substrate may further include solder balls bonded to the first and second filled via pads.

In another aspect, the present invention provides a method of manufacturing a coreless substrate having filled via pads, including: (A) forming a first insulating layer on one side of a carrier; (B) forming a build-up layer including a build-up insulating layer and a build-up circuit layer having a build-up via on the first insulating layer, and forming a second insulating layer on the build-up layer; (C) removing the carrier, and forming via-holes in the first and second insulating layers; and (D) conducting a filled plating process in the via-holes of the first and second insulating layers thus forming first and second filled via pads therein.

The method may further includes, after (D) conducting the filled plating process, (E) subjecting surfaces of the first and second filled via pads to an organic solderability preservative (OSP) treatment or a formation of an electroless nickel immersion gold (ENIG) layer thereon.

The method may further include, after (D) conducting the filled plating process, (E) forming solder balls on the first and second filled via pads.

In the method, the carrier may include a copper clad laminate including an insulating resin layer and a thin copper layer formed on at least one side of the insulating resin layer, and a release layer disposed on the copper clad laminate.

In the method, (D) conducting the filled plating process may include: (D1) forming seed layers on the first and second insulating layers including the via-holes; (D2) applying a resist layer on the first and second insulating layers and patterning the resist layer to form openings through which the via-holes are exposed; (D3) forming filled plating layers on the via-holes exposed through the openings; (D4) eliminating the resist layers; and (D5) eliminating the seed layers and the filled plating layers on the first and second insulating layers to form first and second filled via pads.

In (D1) forming seed layers, the seed layers may be formed through an electroless plating process or a sputtering process.

In the method, (D5) eliminating the seed layers and the filled plating layers may include eliminating the seed layers and the filled plating layers such that surfaces of the first and second filled via pads are flush with surfaces of the first and second insulating layers.

In the method, the first and second filled via pads may have shapes facing each other.

The the method, the second filled via pads and the build-up via have shapes corresponding to each other.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to best describe the method he or she knows for carrying out the invention.

In the following detailed description, it should be noted that the terms "first", "second" and the like are not intended to indicate a specific amount, sequence or significance but are intended to differentiate constituent elements. Furthermore, concerning the designations of reference numerals, it should be noted that the same reference numerals are used throughout the different drawings to designate the same or similar components. Also, in the description of the present invention, when it is considered that the detailed description of a related prior art may obscure the gist of the present invention, such a detailed description is omitted.

Hereinafter, embodiments of the present invention will be described in greater detail with reference to the following drawings.

Figure 6:
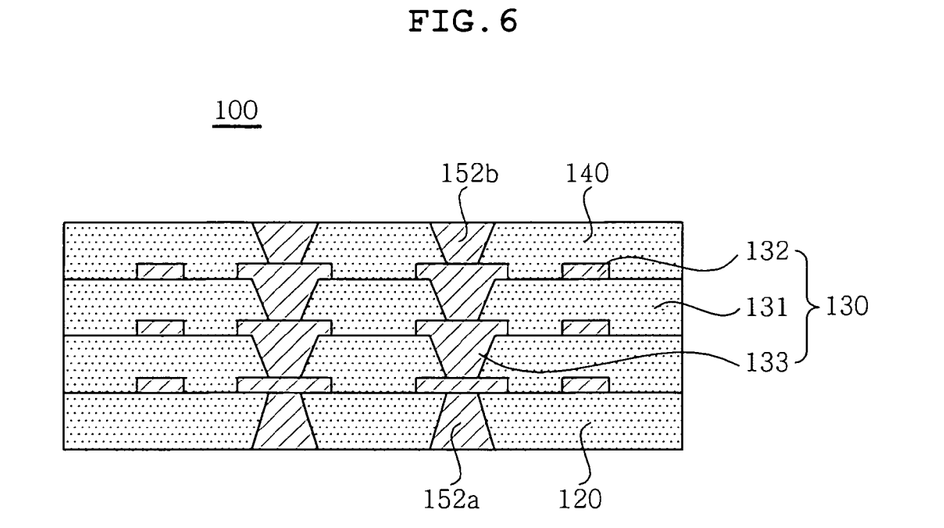
FIG. 6 is a schematic cross-sectional view of a coreless substrate having filled via pads according to an embodiment of the present invention.
Figure 7:
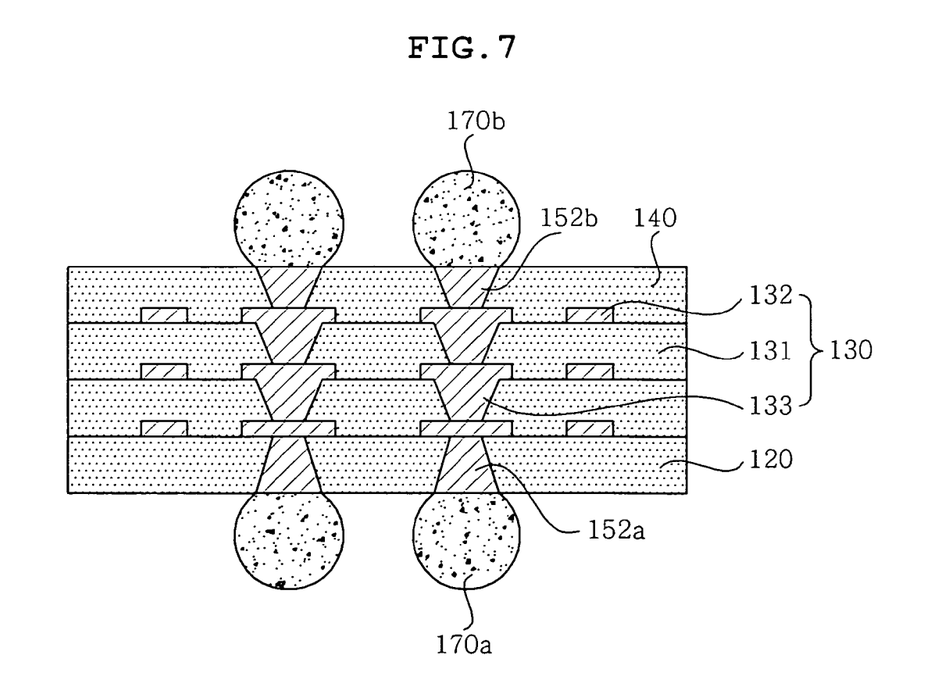
FIG. 7 is a cross-sectional view showing the coreless substrate shown in FIG. 6 in which solder balls are bonded to the filled via pads.

FIG. 6 is a schematic cross-sectional view of a coreless substrate having filled via pads according to an embodiment of the present invention, FIG. 7 is a cross-sectional view showing the coreless substrate shown in FIG. 6 in which solder balls are bonded to the filled via pads, FIGS. 8 to 16 are cross-sectional views showing a process of manufacturing a coreless substrate having filled via pads according to a first embodiment of the present invention, and FIGS. 17 to 26 are cross-sectional views showing a process of manufacturing a coreless substrate having filled via pads according to a second embodiment of the present invention.

Coreless Substrate Having Filled Via Pads

Referring to FIGS. 6 and 7, a structure of a coreless substrate 100 having filled via pads according to an embodiment of the present invention is described below.

The coreless substrate 100 according to the embodiment has a characteristic in that first filled via pads 152a and second filled via pads 152b are formed in a first insulating layer 120 and a second insulating layer 140 formed on both sides of a build-up layer 130, respectively. In this coreless substrate, the build-up layer 130 comprises a build-up insulating layer 131 and a build-up circuit layer 132 including a build-up via 133.

In this embodiment, each of the first filled via pads 152a and the corresponding second via pad 152b have shapes facing each other. In this regard, the expression "having shapes facing each other" indicates that the shapes (cross-sectional shapes) are configured to be plane-symmetrical to each other. For example, as shown in FIG. 6, the first filled via pad 152a having a trapezoidal section and the first filled via pad 152b having an inverted trapezoidal section may be referred to as having shapes facing each other.

Furthermore, the second filled via pad 152b and the build-up via 133 of the build-up layer 130 have shapes corresponding to each other. In this regard, the expression "having shapes corresponding to each other" indicates that the shapes (the cross-sectional shapes) are identical to each other. For example, as shown in FIG. 6, the second filled via pad 152b and the build-up via 133 having an inverted trapezoidal section may be referred to as having shapes corresponding to each other.

The first filled via pads 152a and the second filled via pads 152b are embedded in the respective first and second insulating layers 120 and 140 such that the outer surfaces of the pads are flush with the outer surfaces of the insulating layers.

The first filled via pads 152a and the second filled via pads 152b are provided with solder balls 170a and 170b, respectively, for the connection with exterior connecting terminals.

First Embodiment: Process of Manufacturing a Coreless Substrate Having Filled Via Pads Referring to FIGS. 8 to 16, a process of manufacturing a coreless substrate having filled via pads according to an embodiment of the present invention is described below.

Figure 8:
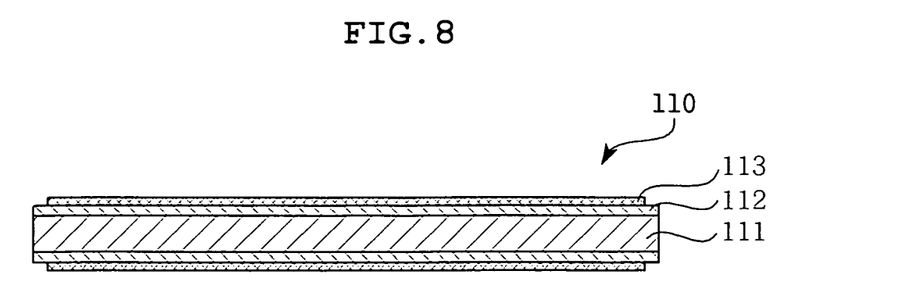
FIGS. 8 to 16 are cross-sectional views showing a process of manufacturing a coreless substrate having filled via pads according to a first embodiment of the present invention.

First, as shown in FIG. 8, a carrier 110, which serves as a support for preventing the coreless substrate from being warped during the manufacturing process, is prepared.

The carrier 110 according to this embodiment is configured such that double-sided copper clad laminate which is composed of an insulating resin layer 111 and thin copper layers 112 formed on the both sides of the insulating resin layer 111 is provided at both sides with release layers 113.

In this embodiment, the double-sided copper clad laminate contains glass material in the insulating layer 111 and has a thickness of about 100-800 µm in order to have a predetermined rigidity.

The release layer 113 may have a length and an area less than those of the thin copper layer 112, and may be formed on the thin copper layer 112 except for the margin areas of both sides thereof. The provision of the release layer 113 is intended to facilitate the detachment of the carrier 110, which will be described in greater detail in the following description of FIG. 11 in which the carrier 110 is separated from a substrate section P. In this regard, the release layer 113 may be formed from typical release material through a thin film coating or sputtering process.

Figure 9:
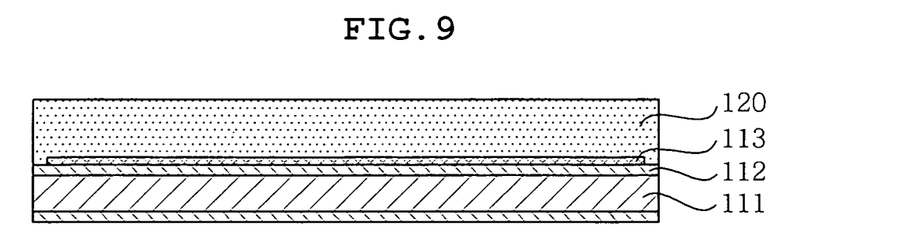

Subsequently, as shown in FIG. 9, a first insulating layer 120 is formed on the carrier 110.

At this point, a peripheral area of the first insulating layer 120 is formed on the thin copper layer 112 of the carrier 110, and the remaining central area of the first insulating layer 120 is formed on the release layer 113 of the carrier 110. In this regard, an adhesive force between the first insulating layer 120 and the thin copper layer 112 are higher than that between the first insulating layer 120 and the release layer 113.

Although FIG. 9 shows the first insulating layer 120 which is formed only on one side of the carrier 110, this is merely provided for the convenience of illustration and explanation. In addition to this, a configuration in which the first insulating layers 120 are formed on both sides of the carrier 110 also falls within the scope of the present invention. Furthermore, it is to be understood that a configuration in which a build-up process is conducted on both sides of the carrier 110 to thus manufacture the coreless substrate also falls within the scope of the present invention.

Figure 10:
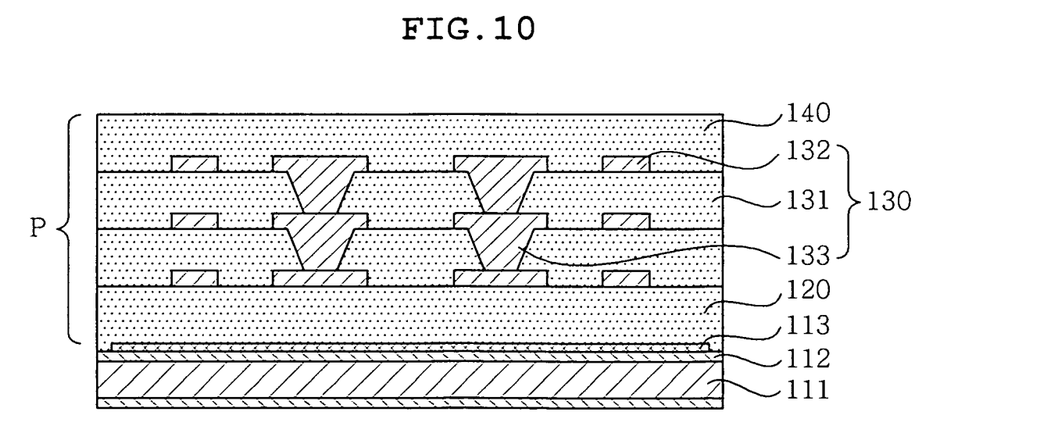

As shown in FIG. 10, a build-up layer 130 which is composed of a plurality of build-up insulating layers 131 and a plurality of build-up circuit layers 132 is formed on the first insulating layer 120 using a typical build-up technology, and then a second insulating layer 140 is formed on the uppermost layer of the build-up layer 130.

In this case, the build-up circuit layer 132 includes build-up vias 133 for the interlayer connection, and the build-up vias 113 are produced in a manner such that via-holes are formed in the build-up layer 131 using laser machining and then a plating process is conducted in the via-holes. In this regard, since the via-holes are formed using the laser machining, they have a cross-sectional shape tapered downwards (an inverted trapezoidal section) (on the basis of FIG. 10).

Figure 11:
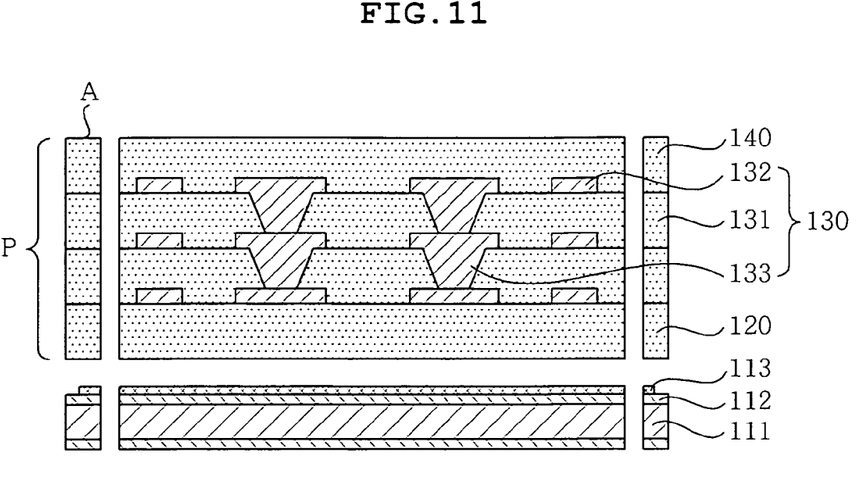

Thereafter, as shown in FIG. 11, lateral side portions A of a substrate section P and the carrier 110 are cut and eliminated through a routing process, and then the carrier 110 is also eliminated. At this point, the routing process refers to a process of mechanically cutting/trimming workpieces using a routing bit.

By the process of cutting and eliminating the lateral side portions A of the substrate section P and the carrier 110, the lateral side portions of the thin copper layer 112 of the carrier 110 and the lateral side portions of the first insulating layer 120, which are attached to each other by a predetermined adhesive force, are eliminated, thus allowing the substrate section P and the carrier 110 to be easily separated from each other. In other words, after the elimination of the substrate section P and the carrier 110, the substrate section P is in a state of being attached to the release layer 113. Consequently, the adhesive force therebetween is weakened, allowing thereby for their easy separation.

Figure 12:
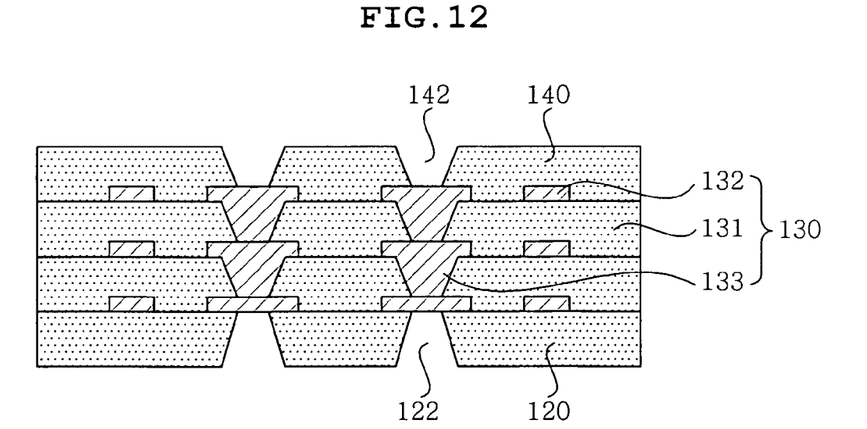

Subsequently, as shown in FIG. 12, first via-holes 122 and second via-holes 142 are formed in the first insulating layer 120 and the second insulating layer 140, respectively.

At this point, the via-holes 122 and 142 are formed using, for example, a $CO_2$ laser or a YAG laser. The second via-holes 142, which are formed in the second insulating layer 140, have a cross-sectional shape tapered downwards (an inverted trapezoidal section) whereas the first via-holes 122, which are formed in the first insulating layer 120, have a cross-sectional shape tapered upwards (a trapezoidal section) (on the basis of FIG. 12).

Figure 13:
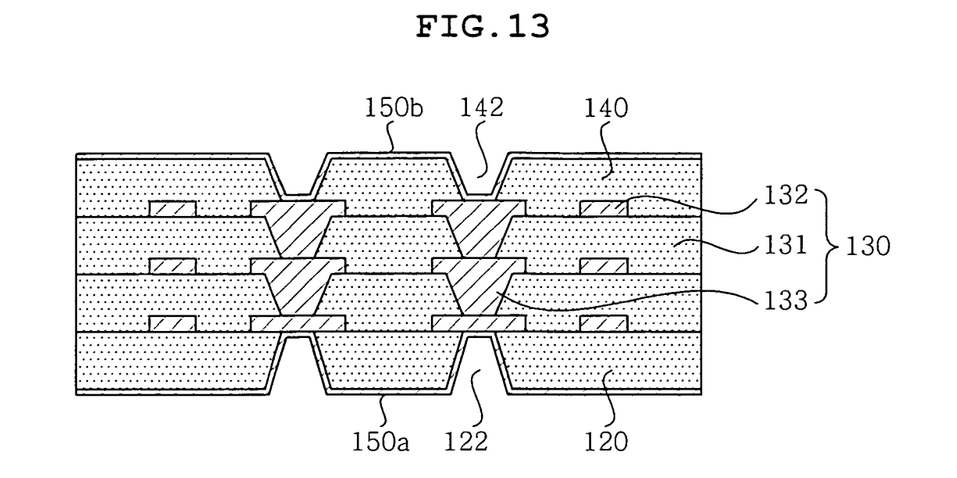

As shown in FIG. 13, seed layers 150a and 150b are formed on the first insulating layer 120 and the second insulating layer 140 including internal walls of the via-holes 122 and 142. At this point, the seed layers 150a and 150b are formed through an electroless plating process or a sputtering process.

Figure 14:
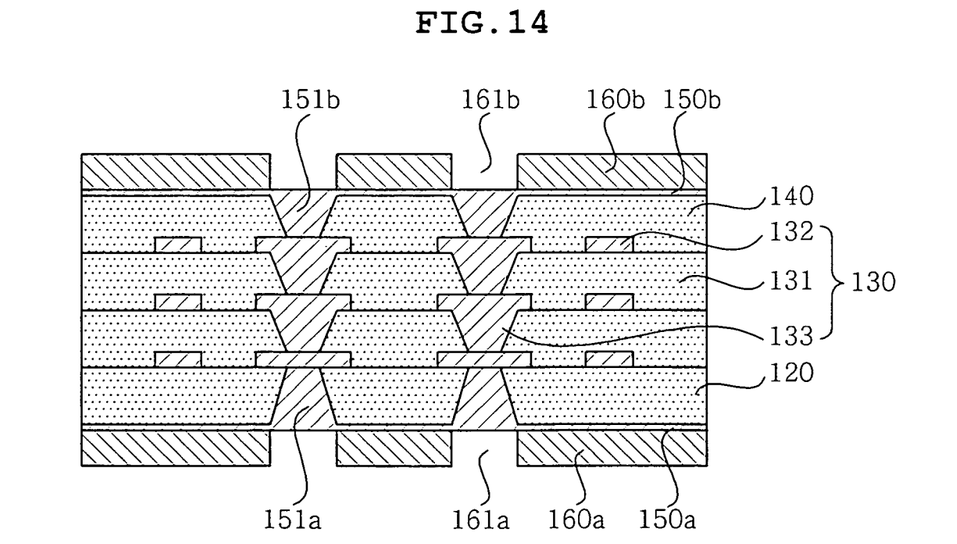

As shown in FIG. 14, resist layers 160a and 160b such as a dry film are applied to the first insulating layer 120 and the second insulating layer 140, the resist layers 160a and 160 are patterned to form openings 161a and 161b through which the via-holes 122 and 142 are exposed, and then filled plating layers 151a and 151b are formed in the via-holes 122 and 142 through an electrolytic plating process.

Figure 15:
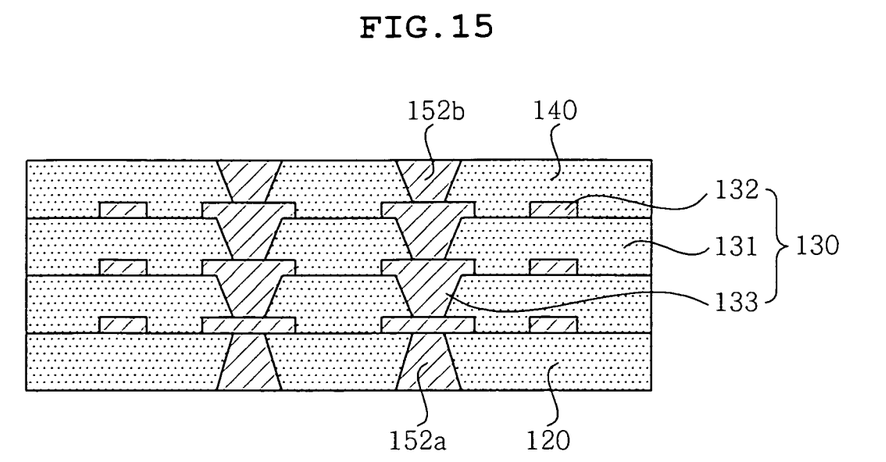

As shown in FIG. 15, the resist layers 160a and 160b are removed, and the portions of the seed layers 150a and 150b and the filled plating layers 151a and 151b which protrude above surfaces of the first and second insulating layers 120 and 140 are eliminated, so that first filled via pads 152a and second filled via pads 152b remain in the via-holes.

In this regard, the seed layers 150a and 150b and the filled plating layers 151a and 151b are eliminated using flash etching or a polishing brush.

The first filled via pads 152a and the second filled via pads 152b may be subjected to OSP treatment and/or a formation of electroless nickel immersion gold (ENIG) layers thereon. At this point, the OSP treatment is conducted in a manner such that organic material is applied onto surfaces of the filled via pads 152a and 152b to prevent contact between air and copper surfaces and oxidation of the copper. It is also referred to as a pre-flux treatment because the organic material applied to the surfaces is almost the same as a flux. In the OSP treatment, since the thin copper layers may be oxidized due to contact between air and the copper surfaces if the organic material is not evenly applied to the filled via pads 152a and 152b, the coreless substrate product should be used as soon as possible after opening of the vacuum packaging.

Figure 16:
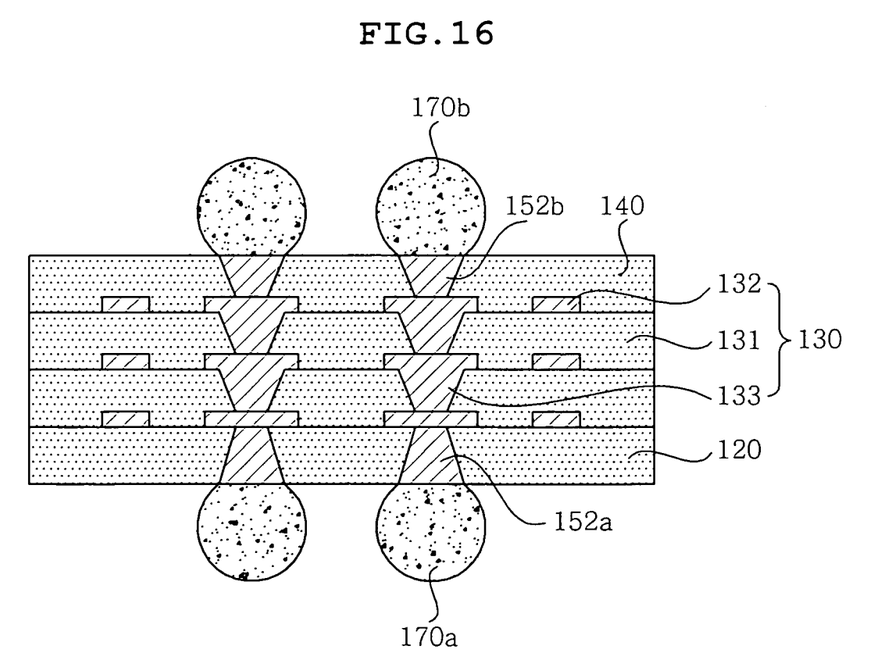

Finally, as shown in FIG. 16, solder balls 170a and 170b are formed on the first filled via pads 152a and the second filled via pads 152b for connection with external connecting terminals.

Second Embodiment: Process of Manufacturing a Coreless Substrate Having Filled Via Pads Referring to FIGS. 17 to 26, a process of manufacturing a coreless substrate having filled via pads according to an embodiment of the present invention is described below. In the following description, it should be noted that components which are similar to or identical to those of the first embodiment are designated by the same reference numerals, and detailed descriptions thereof are omitted.

Figure 17:
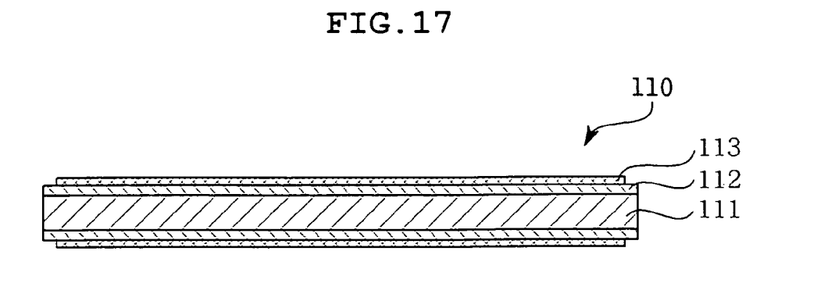
FIGS. 17 to 26 are cross-sectional views showing a process of manufacturing a coreless substrate having filled via pads according to a second embodiment of the present invention.

First, as shown in FIG. 17, a carrier 110, which functions to prevent problems such as warp of the coreless substrate occurring during a build-up process, is prepared.

Figure 18:
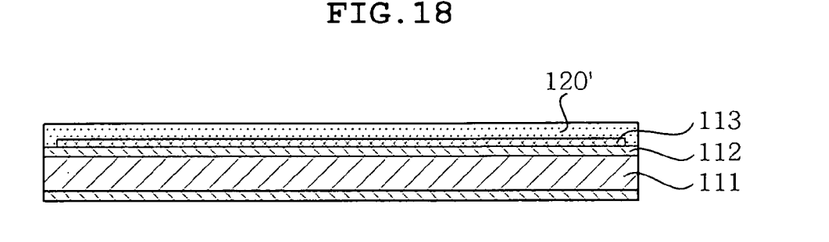

Subsequently, as shown in FIG. 18, a first insulating layer 120' is formed on the carrier 110.

At this point, the first insulating layer 120' is characterized in that it has a thickness which is different and thinner than the first insulating layer 120 of the first embodiment. In this case, the first insulating layer 120' may be a solder resist, and the solder resist may be a film-shaped solder resist rather than a liquid solder resist.

Figure 19:
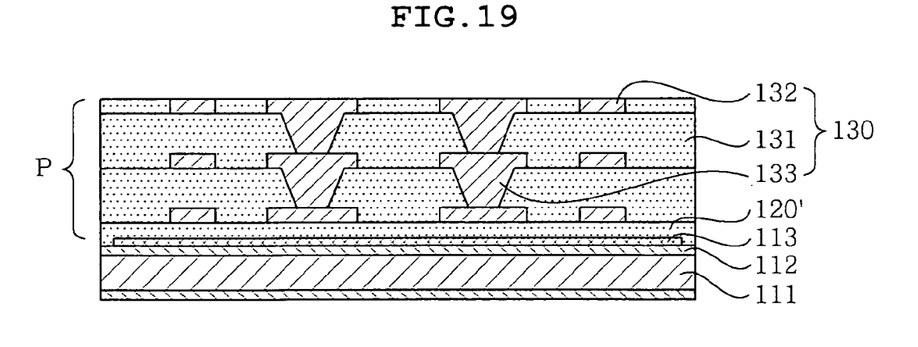

As shown in FIG. 19, a build-up layer 130 which is composed of a plurality of build-up insulating layers 131 and a plurality of build-up circuit layers 132 is formed on the first insulating layer 120' using a typical build-up technology.

Figure 20:
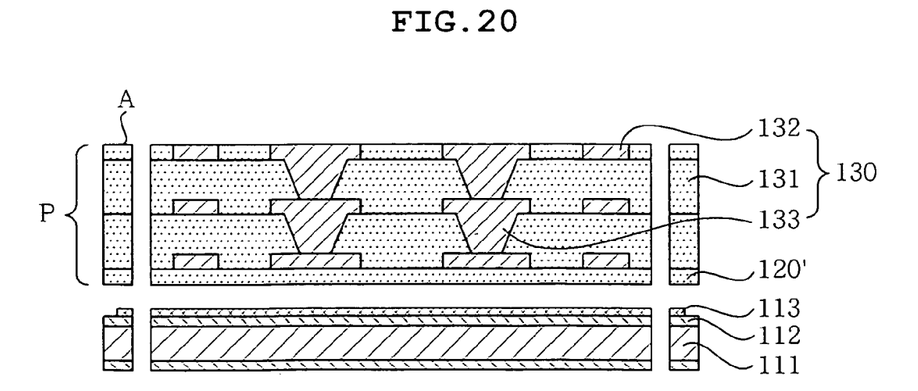

Thereafter, as shown in FIG. 20, lateral side portions A of a substrate section P and the carrier 110 are cut and eliminated through a routing process, and then the carrier 110 is also eliminated.

Figure 21:
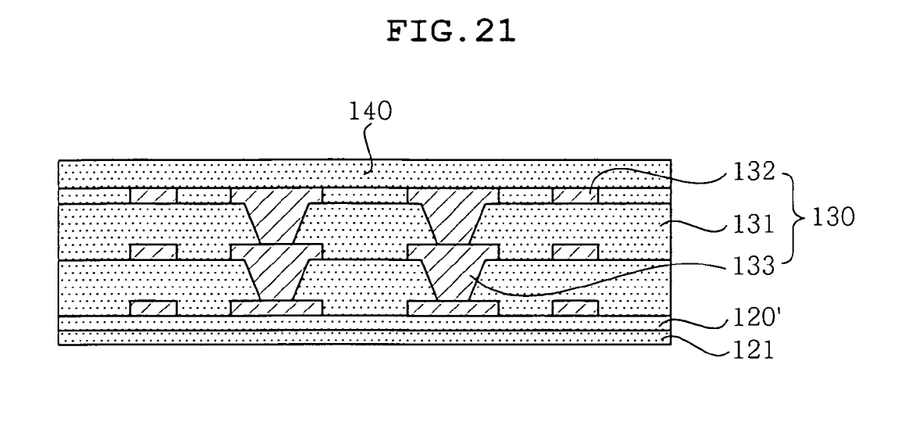

As shown in FIG. 21, a lower insulating layer 121 and a second insulating layer 140 which are thin in thickness are formed on the first insulating layer 120' and the build-up layer 130, respectively.

Figure 22:
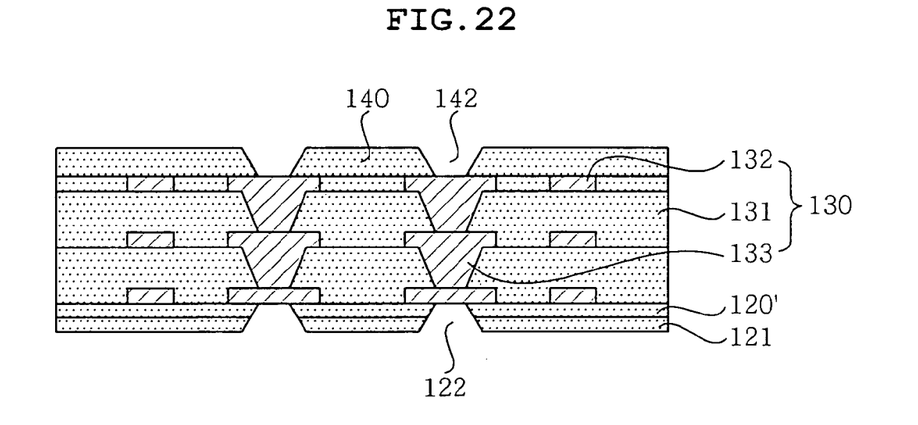

As shown in FIG. 22, first via-holes 122 are formed in the first insulating layer 120' and the lower insulating layer 121, and second via-holes 142 are formed in the second insulating layer 140.

In this context, since the first insulating layer 120', the lower insulating layer 121 and the second insulating layer 140 are thinner than the first embodiment, warp of the coreless substrate during the process of machining the via-holes can be minimized.

Figure 23:
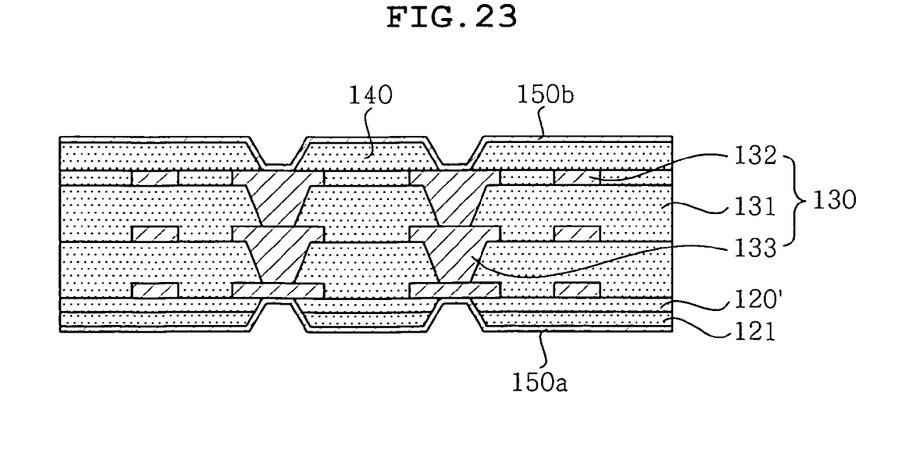

Subsequently, as shown in FIG. 23, seed layers 150a and 150b are formed on the first insulating layer 120', the lower insulating layer 121 and the second insulating layer 140 including internal walls of the via-holes 122 and 142.

Figure 24:
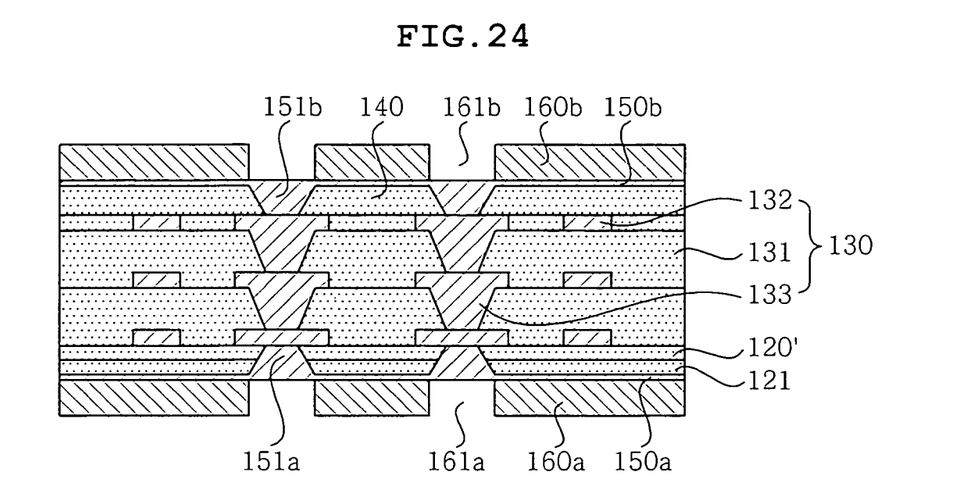

As shown in FIG. 24, resist layers 160a and 160b such as a dry film are applied to the first insulating layer 120', the lower insulating layer 121 and the second insulating layer 140, the resist layers 160a and 160 are patterned to form openings 161a and 161b through which the via-holes 122 and 142 are exposed, and then filled plating layers 151a and 151b are formed in the via-holes 122 and 142 through an electrolytic plating process.

Figure 25:
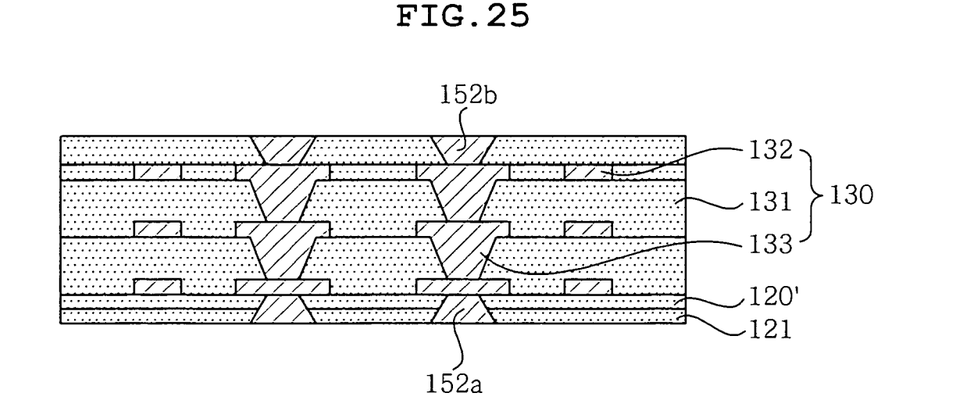

As shown in FIG. 25, the resist layers 160a and 160b are removed, and the portions of the seed layers 150a and 150b and the filled plating layers 151a and 151b which protrude above surfaces of the first and second insulating layers 120 and 140 are eliminated, so that first filled via pads 152a and second filled via pads 152b remain in the via-holes.

Figure 26:
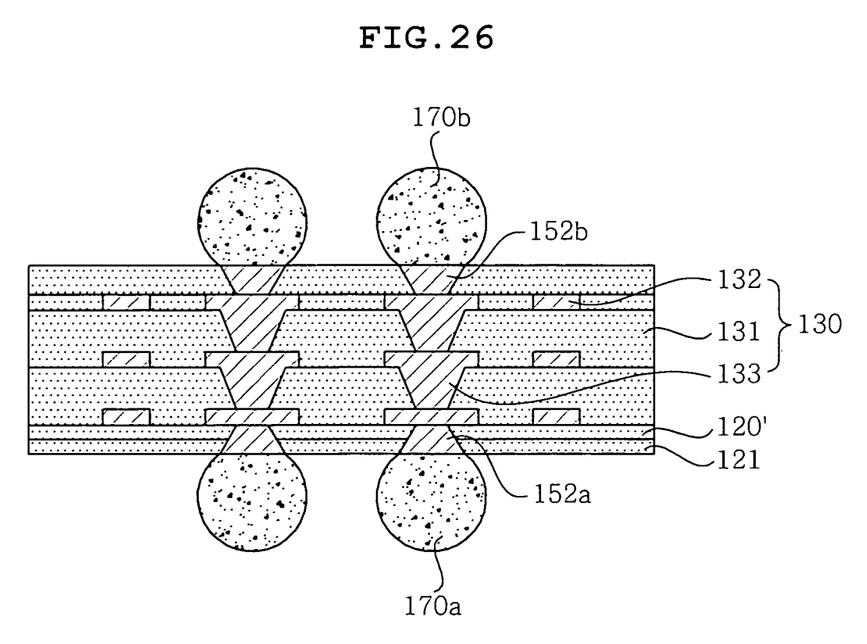

Finally, as shown in FIG. 26, solder balls 170a and 170b are formed on the first filled via pads 152a and the second filled via pads 152b for connection with external connecting terminals.

As described above, the coreless substrate according to the present invention includes filled via pads which are configured to be flush with a surface of an insulating layer. Accordingly, reliability of the pads and flatness of bumps are increased, separation of the pads from the substrate is prevented, and bonding of flip chips is easily achieved.

Also, since the present invention uses a carrier which is composed of a double-sided copper clad laminate and a release layer formed on the double-sided copper clad laminate, manufacturing costs are lowered. In addition, since the present invention does not perform the etching process, manufacturing time is shortened.

Furthermore, since the present invention executes a build-up process on both sides of a carrier, efficiency of process is improved and warp of products is further reduced.

Since the present invention uses filled vias as pads, a drilling or laser machining process for exposing the pads is not required. Consequently, generations of warp and stepped regions are prevented, and reliability is increased because there is no problem of void generation in the case of underfill.

In addition, the present invention has advantages of easy formation of solder balls or bumps and uniform heights and diameters of solder balls or bumps.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A coreless substrate having filled via pads, comprising:
a build-up layer including a plurality of build-up insulating layers and a plurality of build-up circuit layers having a plurality of build-up vias;
a first insulating layer laminated at one side of the build-up layer;
a second insulating layer laminated at the other side of the build-up layer;
a first filled via pad, to which a solder ball is attachable and that is formed to penetrate both sides of the first insulating layer;
a second filled via pad, to which a solder ball is attachable and that is formed to penetrate both sides of the second insulating layer,
the first and second filled via pads being embedded in the first and second insulating layers, respectively, a surface of the first and second filled via pads being flush with a surface of the respective insulating layer, and the first and second filled via pads being formed as a filled plating layer.

2. The coreless substrate according to claim 1, wherein the first filled via pad having a trapezoidal section, and the second filled via pad having an inverted trapezoidal section have shapes facing each other.

3. The coreless substrate according to claim 1, further comprising solder balls bonded to the first and second filled via pads.

4. The coreless substrate according to claim 1, wherein the second filled via pad and the build-up via have the same shapes.

* * * * *